United States Patent
Radkevich et al.

(10) Patent No.: US 8,114,218 B2
(45) Date of Patent: Feb. 14, 2012

(54) CRUCIBLE FOR A CRYSTAL PULLING APPARATUS

(75) Inventors: Olexy V. Radkevich, Schaumburg, IL (US); Keith Ritter, Addison, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 834 days.

(21) Appl. No.: 12/202,453

(22) Filed: Sep. 2, 2008

(65) Prior Publication Data

US 2010/0050930 A1    Mar. 4, 2010

(51) Int. Cl.
*C30B 15/10*    (2006.01)

(52) U.S. Cl. ........ 117/213; 117/200; 117/206; 117/208; 117/217; 117/11; 117/13; 117/17; 117/18; 117/30; 117/31

(58) Field of Classification Search .......... 117/200–224, 117/11, 13, 17–18, 30–31
See application file for complete search history.

(56) References Cited

U.S. PATENT DOCUMENTS

| | | | | |
|---|---|---|---|---|
| 3,716,345 A | * | 2/1973 | Grabmaier | 117/31 |
| 4,203,951 A | * | 5/1980 | Goriletsky et al. | 117/213 |
| 4,352,784 A | * | 10/1982 | Lin | 117/213 |
| 4,894,206 A | * | 1/1990 | Yamashita et al. | 117/213 |
| 5,256,381 A | * | 10/1993 | Tada et al. | 117/213 |

* cited by examiner

*Primary Examiner* — Michael Kornakov
*Assistant Examiner* — Kenneth A Bratland, Jr.
(74) *Attorney, Agent, or Firm* — Peter L. Kendall

(57) ABSTRACT

A single crystal pull apparatus has a multilayer crucible wherein the crucible has an outer crucible, an insertable layer intimately fitted thereon, and a wire frame positioned between the insertable layer and an inner crucible. The insertable layer, wire frame and inner crucible are preferably composed of platinum. Furthermore the insertable layers have thin walls and the frame has a small diameter such that they can be easily reshaped after any deformation occurring as a result of the single crystal growth process.

20 Claims, 3 Drawing Sheets

CRUCIBLE FOR A CRYSTAL PULLING APPARATUS

BACKGROUND OF THE INVENTION

1. Field of the Invention

The present invention generally relates to apparatus for growing single crystals from a melt. In particular, the present invention relates to an apparatus for growing single crystals from a melt having a multilayer crucible which can be reshaped when deformed by the growth process.

2. Description of the Background Art

Large single crystals are used in a variety of applications, in particular as scintillation materials in nuclear imaging applications, such as positron emission tomography (PET), and Single Photon Emission Computed Tomography (SPECT). Some of the materials used to form these crystals include sodium chloride, potassium chloride, potassium bromide, lithium fluoride, sodium iodide, cesium iodide, etc. Additionally, single crystals are used for semiconductor applications and produced from, for example, germanium, silicon, solid solutions of tin and lead tellurides.

One of the more widely used methods of forming large single crystals includes pulling a crystal from a melt contained in a crucible using an initial seed crystal. The apparatus used for such a process involves a sealed chamber with cooled walls and a crucible accommodated in a lower portion thereof. Generally, the central axis of the chamber will be vertically aligned with the central axis of the crucible. Heaters are positioned proximate to the crucible and provided with insulating material. The apparatus also has a vertical rod extending from the upper portion of the chamber with its central axis also aligned with the central axis of the crucible. At the lower end of the rod is a holder for a crystal seed. Drivers are provided to impart torque to the rod so that it can rotate about its axis.

Generally, for operation of the apparatus, the crucible is heated to melt the contents therein and a rod is lowered until the crystal seed comes into contact with the melt material. The seed crystal will partially melt away and the temperature subsequently lowered to terminate melting and begin freezing of the melt onto the seed. The rotating rod is slowly pulled and the temperature is controlled to affect the growth of the crystal and prevent further growth when the crystal has reached the desired dimensions.

A representative single crystal pull apparatus according to the prior art is illustrated in FIG. 1. As can be seen therein, the apparatus has a lower chamber 1 and an upper chamber 2. Extending from the upper chamber 2 and into the lower chamber 1 is a vertical rod 3 whose rotational axis is aligned with the central axis of the upper chamber 2. At the lower end of the vertical rod 3 is a holder 4 for holding the crystal seed 5. The crystal seed 5 is used for initiating the formation of a new single crystal from the melt material in lower chamber 1. A motor drive is used to raise and lower the vertical rod 3 as well as impart axial rotation thereto. Arranged in the lower chamber 1 is the crucible 6 whose central rotation axis is also aligned with the rotational axis of vertical rod 3. The crucible 6 is made up of an inner crucible 7 as well as an outer container 8. Outer container 8 forms an annular well around the inner crucible 7 and is spaced above the level of any melt contained in the inner crucible 7. Apertures 9 are formed in the bottom of the wall of outer container 8 to allow entry of melt material from the outer container 8 to the inner crucible 7. Mounted on the edge of the outer container 8 is an outwardly projecting flange 10 which rests on a support ring 11. The support ring 11 is carried by a cylindrical stand 12 which is mounted to a gear 13.

A feeding tube 14 is also arranged to supply the raw material to be melted, usually a comminuted powder. The powder is charged to the outer container 8 surrounding the inner crucible, which powder is thereafter melted and passes through the apertures 9 into the inner crucible 7. A driver is also generally used to charge the raw material to the feeding tube 14.

Furthermore, side heaters 15 can be positioned around the sides of the crucible 7 and lower heaters 16 can be positioned below the crucible 7. The side heaters 15 and lower heaters 16 can be controlled independently of one another so the temperature can be more easily managed and controlled. The side heaters 15 and lower heaters 16 are mounted on pedestals 17 and 18 which are made up of insulating material thereby containing the generated heat.

Before commencing operation of the apparatus, the crucible 6 is mounted on the support ring 11, and the initial material is charged into the crucible. A drive is employed to gear 13 to transmit torque to crucible support ring 11 and cylindrical stand 12 to cause rotation of the crucible about its central axis. The drive for rotating vertical rod 3 is energized to begin axial rotation thereof. The side heaters 15 and lower heaters 16 are then started so that the initial material contained in crucible 6 is melted into melt 19. Thereafter, the seed crystal 5 is slowly lowered until it contacts the melt 19. As a result, the seed crystal 5 is partially melted, after which, an equilibrium is established between the seed crystal 5 and the melt 19, so that there is neither melting nor crystallization of the seed crystal 5. The driver is initiated for raising the vertical rod 3 and holder 4 of the crystal seed 5 as well as for the charge to feeding tube 14.

In order to obtain the desired diameter of single crystal 20, the rate at which the vertical rod 3 is raised is held constant and at the same time, the temperature of the bottom heater 16 is controlled. During the stage of growing the single crystal 20 from the seed crystal 4 to the desired diameter, the rate of charge of material from the feed tube 14 is gradually increased in proportion to the mass rate of growth of the single crystal 20. After the desired diameter of the single crystal 20 is achieved, the feed rate from feed tube 14 is then maintained at a constant level, so as a result, the diameter of the single crystal 20 will also remain the same.

In order to obtain the single crystal 20 with the desired properties, it is generally desirable to ensure a stable thermal field at the interface of the single crystal 20 and the melt 19. By coordinating the mass growth rates of the single crystal and feeding of raw material throughout all stages of the growth process, the level of the melt 19 in the crucible 6 will not change its position relative to the side heaters 15 and lower heaters 16. Accordingly, the solid-liquid interface between the single crystal 20 and melt 19 will also not change relative to the side heaters 15 and lower heaters 16. As a result, the thermal conditions will remain stable at this interface of the single crystal 20 and melt 19 to produce a uniform crystal with desired properties.

As shown above, the design of the crucible and its component parts is complex in configuration. Furthermore, the conventional material for the crucible when growing sodium iodide crystals is platinum and the thickness of the crucible wall is about 3 mm. Due to the thickness of the crucible wall, the quantity of platinum required for the crucible is great. As a result, such crucibles are extremely expensive.

Furthermore, the crucible is difficult to reshape into its original configuration after it has been deformed by the temperature variations required by the growth process. As discussed previously, the growth process requires high temperatures for melting the raw material. Additionally, lower temperatures are required for freezing the material to form the crystal. The changes in temperature due to melting and freezing of the material cause deformation of the crucible material. In order to re-use the crucible it must be reshaped into its original configuration for reproducible conditions of the growth process. However, due to its shape and the thickness of the walls, operators have difficulty reshaping the material to its original configuration, after which it can be re-used for growing crystals.

What is needed therefore is a crucible with improved reliability and which can easily be reshaped and re-used for growing crystals after deformation.

SUMMARY OF THE INVENTION

It is an object of the invention to provide a single crystal pull apparatus with an improved crucible which enables for ease of reshaping after deformation by the growth process. Furthermore, in some embodiments of the invention the crucible is comprised of thin sidewalls to facilitate such reshaping and reduce overall cost. In even further embodiments, there is provided a crucible which is simple in design and facilitates assembly for multiple uses and reshaping.

According to one embodiment, the present invention is an apparatus for growing single crystal from a melt comprising
an outer crucible having an inner surface;
an insertable layer conformable to the inner surface of said outer crucible whereby a tight fit is obtained therewith;
an inner crucible configured to rest on said insertable layer having at least one hole for said melt to pass therethrough and also having an upper portion extending above a level of the melt and spaced apart from said outer crucible thereby forming a spacing between said inner crucible and outer crucible;
a wire frame configured to rest between said inner crucible and insertable layer having a diameter sufficient to provide a gap for the melt to pass into said inner crucible, and
wherein said inner crucible and wire frame are sufficiently malleable to be reformed to an original configuration using simple tools.

In additional embodiments, the spacing between the inner crucible and outer crucible can form an annular well. A feeding tube can also be provided for charging raw material to the annular well to become part of said melt. In still further embodiments, a support for the outer crucible can be provided as well as a drive for applying a torque to said outer crucible causing rotation.

The apparatus can further comprise a rod having a central axis aligned with a central axis of said outer crucible, and a holder attached to an end of said rod for holding a seed crystal. In still further embodiments a drive can be provided which is configured to lower the seed crystal to the melt and raise the seed crystal from the melt.

Heaters for heating the outer crucible or annular well can also be provided. In further embodiments, the interior of the outer crucible has a parabolic shape with the lowest portion being the center of said outer crucible and sides curving upwards to a top edge of the upper portion of said outer crucible. Additionally, the insertable layer, wire frame, and inner crucible can be made to conform to the shape of said interior of said outer crucible.

According to another embodiment, the invention is a method for growing a single crystal from a melt comprising:
lowering a crystal seed attached to a rod to a melt contained in a multilayer crucible, said multilayer crucible comprising:
an outer crucible having an inner surface;
an insertable layer conformable to the inner surface of said outer crucible whereby a tight fit is obtained therewith;
an inner crucible configured to rest on said insertable layer having at least one hole for said melt to pass therethrough and also having an upper portion extending above the level of said melt and spaced apart from said outer crucible thereby forming a spacing between said inner crucible and outer crucible; a wire frame configured to rest between said inner crucible and insertable layer having a diameter sufficient to provide a gap for said melt to pass into said inner crucible, and
wherein said inner crucible and wire frame are sufficiently malleable to be reformed to an original configuration using simple tools.

DETAILED DESCRIPTION OF THE INVENTION

Figure 1:
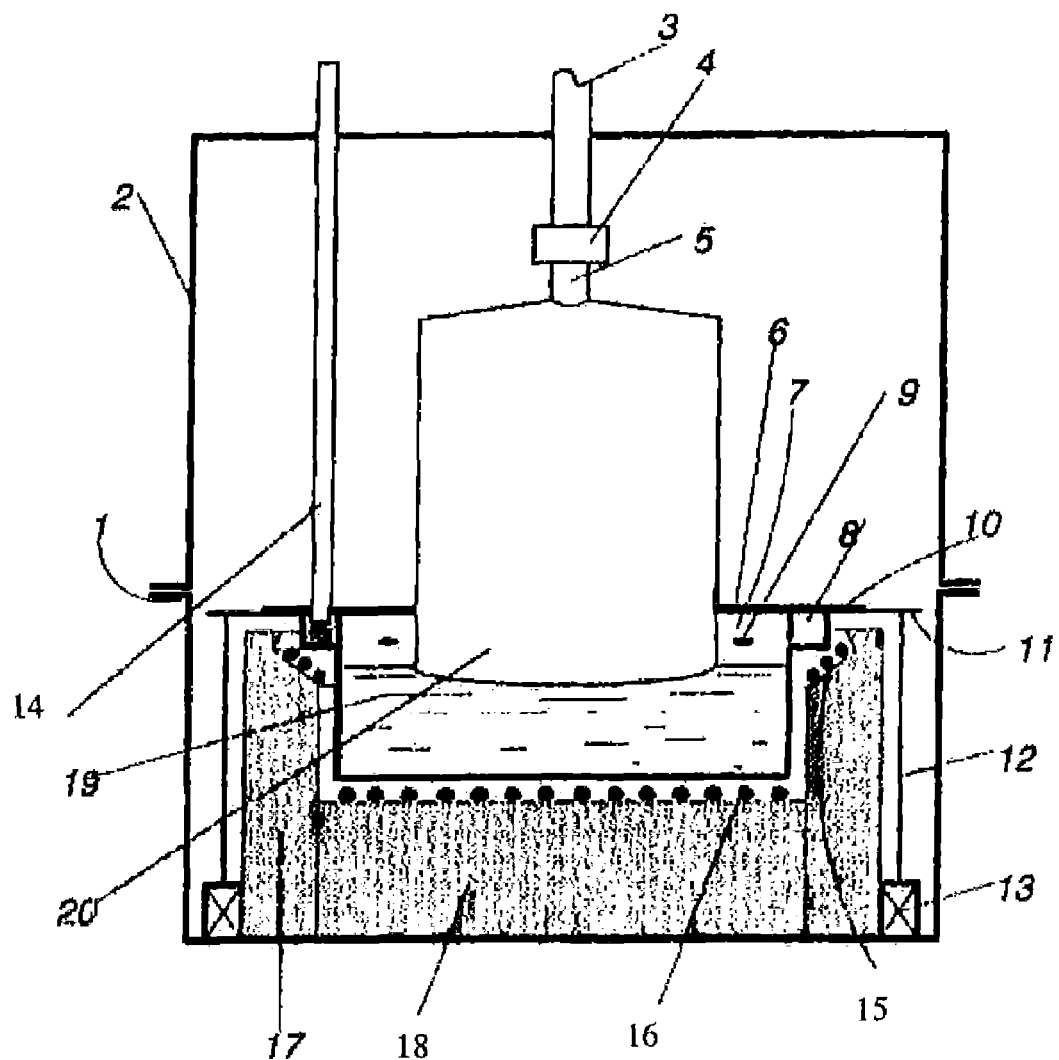
FIG. 1 is an example of a single crystal pull apparatus of the prior art.
Figure 2:
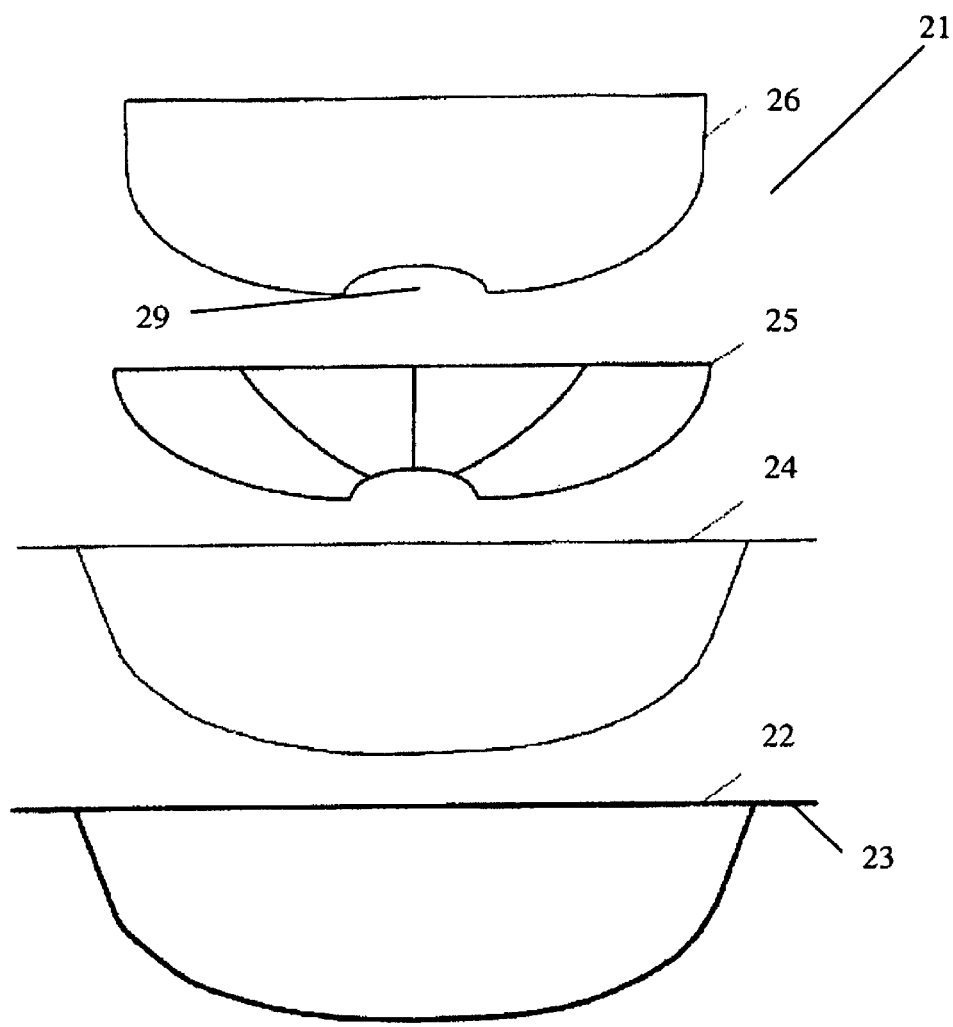
FIG. 2 is an embodiment of a multilayer crucible according to the present invention with the component parts separated.
Figure 3:
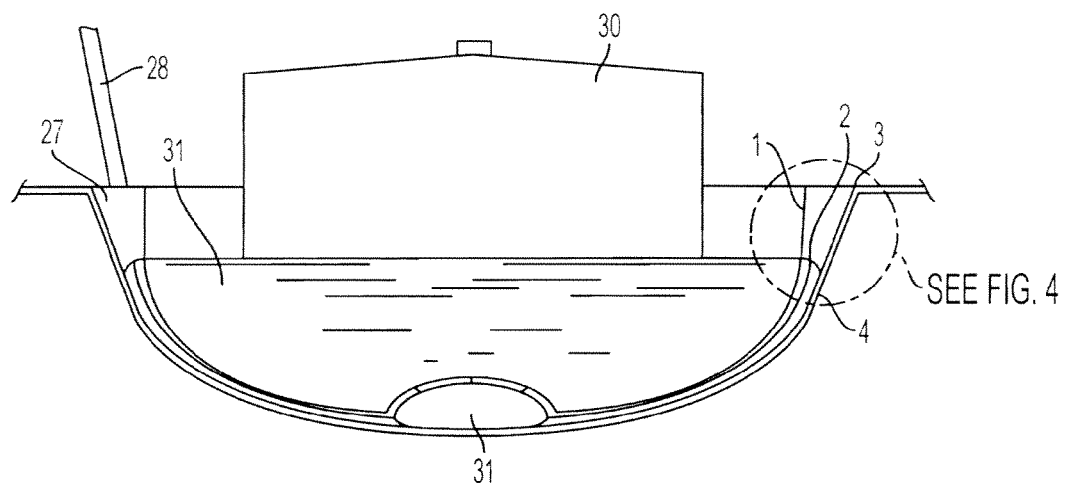
FIG. 3 is an embodiment of an assembled multilayer crucible according to the present invention.
Figure 4:
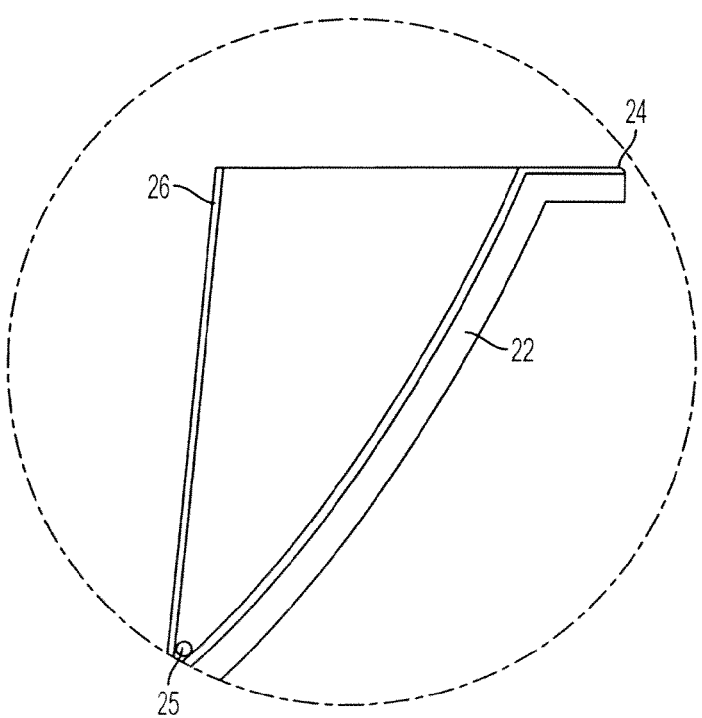
FIG. 4 is an expanded view of an embodiment of the upper portion of the multilayer crucible.

Several embodiments of the present invention provide for a single crystal pull apparatus using an improved crucible. One embodiment of the improved crucible in the form of a multilayer crucible 21 is shown in FIGS. 2-4. As illustrated in FIG. 2, an outer crucible 22 is shown and is preferably made from nickel or a nickel alloy. In the preferred embodiment, the outer crucible 22 will have a parabolic shape in that the sides will curve smoothly down from the edge of the top portion and flatten toward the base of the crucible near its center. Furthermore, the outer crucible 22 can be circular in shape. Other shapes can be used; however, they should be such that the thermal field within the apparatus remains stable. In other embodiments, the outer crucible 22 is shaped like a bowl, with the middle of the bowl forming a substantially flat bottom and the sides curving upwards to form an upper edge.

In some embodiments, on the upper portion of the outer crucible 22, a flange 23 can extend outward from the edge of the outer crucible 22. As further shown in FIG. 2, an insertable layer 24 can be placed inside the outer crucible 22. The insertable layer 24 preferably is made of platinum with a wall thickness of from about 0.2 mm to about 1.0 mm, and preferably, from about 0.3 mm to about 0.8 mm, more preferably from about 0.4 to about 0.7 mm, and still more preferably, from about 0.4 mm to 0.6 mm, and most preferably the wall thickness is about 0.5 mm. Alternatively, the thickness of the insertable layer 24 can be 1 mm or less, more preferably 0.7 mm or less, still more preferably 0.5 mm or less. However, in some embodiments, the insertable layer 24 can be a disposable insert made of quartz as an inexpensive alternative to platinum, as the quartz material will be destroyed by the crystal growth process. The insertable layer 24 should be shaped to have a tight and intimate fit with outer crucible 1. In particular, the insertable layer 24 preferably conforms to the shape of the inner surface of the outer crucible 22. Accordingly, the insertable layer 24 should have a parabolic shape with the lowest portion being at the center and sides curving upwards to a top edge of the upper portion. Furthermore, the insertable layer 24 preferably covers the whole surface of the outer crucible 22, including the flange 23. Optionally, the insertable layer 24 covers the outer crucible up to and above the height of any melt contained therein.

As further shown in FIG. 2, a wire frame 25 can be placed in the insertable layer 24. The wire frame 25 can be made of platinum wire having a diameter of from about 0.2 mm to about 1.0 mm, preferably, from about 0.3 mm to about 0.8 mm, more preferably from about 0.4 to about 0.7 mm, still more preferably, from about 0.4 mm to 0.6 mm, and most preferably the diameter is about 0.5 mm. Alternatively, the diameter of the wire frame 25 can be 1 mm or less, more preferably 0.7 mm or less, still more preferably 0.5 mm or less. Additionally, an inner crucible 26 is also shown in FIG. 2 and can be placed in wire frame 25. Wire frame 25 will rest between insertable layer 24 and inner crucible 26. Preferably, the wire frame 25 should be designed and arranged so that there is a space between the insertable layer 24 and the inner crucible 26. As a result, there will always be a space between them equivalent to the diameter of the wire frame. Accordingly, if the diameter of the wire frame 25 is 5 mm, the space between the insertable layer 24 and the inner crucible 26 would also be 5 mm. This allows a melt to pass between the insertable layer 24 and inner crucible 26 and enter the interior of the inner crucible 26 through one or more holes 29. Alternatively, the wire can be bent and configured to a position where it holds the inner crucible 26 further from the insertable layer 24 than just the diameter of the wire frame 25. For example, if the wire is looped over itself or bent inwards, it will create additional space between the inner crucible 26 and insertable layer 24 than just the diameter of the wire itself.

One design embodiment for the wire frame is shown in FIG. 2. The wire frame 25 can be designed such that there is wire around the circumference of the top thereby forming an upper ring. The wire can then extend downward and curve inward, reaching a lower wire portion forming an inner ring having a smaller diameter than the upper ring. Extending between the upper and lower ring can be at least one wire portion. When more than one wire portion extends between the upper and lower ring the portions can be spaced in equal distance from one another, or alternatively unequal distances. The lower ring can also formed into arch extending upward and inward for example following the shape of a hole in the lower portion of the inner crucible 26. The wire frame can be one continuous wire length or can be several wire pieces assembled together.

The inner crucible 26 conforms to the shape of the outer crucible 22 in its lower part. Therefore, the inner crucible 26 will have a bowl like shape with a lower portion which is substantially flat, similar to the outer crucible and then curve upwards to the outer edge. The upper portion of the inner crucible 26 will be spaced apart from the outer crucible 22 and the insertable layer 24 covering the inner part of the outer crucible. Thus, the walls of the inner crucible 26 as they curve upwards toward the outer edge will curve further inward than the outer crucible 22. As a result, there will be a larger space between the inner crucible 26 and the outer crucible 22 toward the upper portions of each thereby forming an annular well 27 between the two, as shown in FIG. 3. A feed tube 28 as shown in FIG. 3 will charge raw material to this annular well 27 to be melted by heat generated by side heaters. After melting, the raw material will pass into the space formed by the diameter of the wire frame 25 between the inner crucible 26 and insertable layer 24. The melt can then pass through the one or more holes in the inner crucible 26 into its interior. As shown in FIG. 2, there can be one large hole 29 in the center bottom portion of the inner crucible 26, however, this hole can also be placed off center or along the side, or alternatively there can be more than one hole placed in the center, off-center, and through the sides of the inner crucible 26 to allow the melt to pass therethrough. Also, a hole in the lower portion of the inner crucible can arch curve inward toward the interior of the crucible. The inner crucible 26 can be made of platinum and have a wall thickness of from about 0.2 mm to about 1.0 mm, preferably, from about 0.3 mm to about 0.8 mm, more preferably from about 0.4 to about 0.7 mm, still more preferably, from about 0.4 mm to 0.6 mm, and most preferably the wall thickness is about 0.5 mm. Alternatively, the thickness of the inner crucible 26 can be 1 mm or less, more preferably 0.7 mm or less, still more preferably 0.5 mm or less.

An embodiment showing the multilayer crucible 21 fully assembled is illustrated in FIG. 3 also showing a single crystal 30 contacting a melt 31 contained within the multilayer crucible. It is preferable that all parts of the multilayer crucible are joined tightly together, except for the upper portion of the inner crucible 26 and outer crucible 22, allowing room for the annular well 27. As can be seen, the insertable layer 24 fits intimately with the outer crucible 22. The wire frame 25 is placed between the inner crucible 26 and outer crucible 22 (including insertable layer 24). Furthermore, as shown in FIG. 4, the wire frame 25 will be preferably positioned so that at least one portion of the wire frame is located at the point where the inner crucible 22 meets insertable layer 24. Moreover, in the preferred embodiment, the level of the melt 31 is set at the point where the inner crucible 26 and the insertable layer 24 meet.

The three parts of the multilayer crucible: insertable layer 24, the wire frame 25, and the inner crucible 26, will all deform as a result of the changing temperatures required by the growth process. As discussed above this deformation is a result of the heating of the raw material to form the melt, and the freezing of the melt to form the single crystal as the seed crystal is pulled. However, as a result of the smooth shape and thin walls and diameter of the component parts of the multilayer crucible, reshaping these parts using simple tools will be easy for an operator of the single crystal pull apparatus.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

What is claimed is:

1. An apparatus for growing a single crystal from a melt comprising:
   an outer crucible having an inner surface; an insertable layer conformable to the inner surface of said outer crucible and intimately inserted therein;
   an inner crucible configured to rest on said insertable layer having at least one hole for said melt to pass thereinto and also having an upper portion extending above a level of said melt and spaced apart from said outer crucible thereby forming a spacing between said inner crucible and outer crucible;
   a wire frame configured to rest between said inner crucible and said insertable layer, said wire frame being comprised of wire, said wire having a diameter sufficient to provide a gap for said melt to pass into said inner crucible, and
   wherein said inner crucible and wire frame are sufficiently malleable to be reformed to an original configuration by hand.

2. The apparatus of claim 1, wherein said spacing between said inner crucible and outer crucible forms an annular well.

3. The apparatus of claim 2, further comprising a feeding tube for charging raw material to said annular well to become part of said melt.

4. The apparatus of claim 3, further comprising a support for said outer crucible and a drive for applying a torque to said outer crucible causing rotation thereof.

5. The apparatus of claim 4, further comprising a rod having a central axis aligned with a central axis of said outer crucible, and a holder attached to an end of said rod for holding a seed crystal.

6. The apparatus of claim 4, further comprising a drive configured to lower said seed crystal to said melt and raise said seed crystal.

7. The apparatus of claim 6, further comprising heaters for heating said outer crucible.

8. The apparatus of claim 1, wherein said outer crucible comprises nickel or a nickel alloy.

9. The apparatus of claim 1, wherein said insertable layer comprises platinum.

10. The apparatus of claim 1, wherein said insertable layer comprises quartz.

11. The apparatus of claim 1, wherein said wire frame is deformable.

12. The apparatus of claim 1, wherein said wire frame comprises platinum.

13. The apparatus of claim 1, wherein said inner crucible comprises platinum.

14. The apparatus of claim 1, wherein the interior of said outer crucible has a parabolic shape with the lowest portion being the center of said outer crucible and sides curving upwards to a top edge of the upper portion of said outer crucible.

15. The apparatus of claim 14, wherein the insertable layer, wire frame, and inner crucible conform to the shape of said interior of said outer crucible.

16. The apparatus of claim 1, wherein the wall thickness of said insertable layer is less than about 0.7 mm.

17. The apparatus of claim 1, wherein the wall thickness of the wall of said inner crucible is less than about 0.7 mm.

18. The apparatus of claim 1, wherein the wire has a diameter of less than about 0.7 mm.

19. A method for growing a single crystal from a melt comprising: lowering a crystal seed attached to a rod into a melt contained in a multilayer crucible, said multilayer crucible comprising:
   an outer crucible having an inner surface;
   an insertable layer conformable to the inner surface of said outer crucible and intimately inserted therein;
   an inner crucible configured to rest on said insertable layer having at least one hole for said melt to pass thereinto and also having an upper portion extending above the level of said melt and spaced apart from said outer crucible thereby forming a spacing between said inner crucible and outer crucible;
   a wire frame configured to rest between said inner crucible and said insertable layer said wire frame being comprised of wire, said wire having a diameter sufficient to provide a gap for said melt to pass into said inner crucible, and
   wherein said inner crucible and wire frame are sufficiently malleable to be reformed to an original configuration by hand.

20. A multilayer crucible, comprising:
   an outer crucible having an inner surface;
   an inner crucible configured to rest on said inner crucible having at least one hole for said melt to pass thereinto and also having an upper portion extending above a level of said melt and spaced apart from said outer crucible thereby forming a spacing between said inner crucible and outer crucible;
   a wire frame configured to rest between said inner crucible and said outer crucible, said wire frame being comprised of wire, said wire having a diameter sufficient to provide a gap for said melt to pass into said inner crucible, and
   wherein said inner crucible and wire frame are sufficiently malleable to be reformed to an original configuration by hand.

* * * * *